US011356126B2

(12) United States Patent
Alam et al.

(10) Patent No.: US 11,356,126 B2
(45) Date of Patent: Jun. 7, 2022

(54) DETECTING HIGH TX LEAKAGE TO IMPROVE LINEARITY

(71) Applicant: Intel Corporation, Santa Clara, CA (US)

(72) Inventors: Mohammed Alam, Chandler, AZ (US); David Graham, Gilbert, AZ (US); Jorge Ivonnet, Chandler, AZ (US); Hasham Khushk, Moreno Valley, CA (US); James Gregory Mittel, Santa Clara, CA (US); John J. Parkes, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/958,131

(22) PCT Filed: Mar. 30, 2018

(86) PCT No.: PCT/US2018/025442
§ 371 (c)(1),
(2) Date: Jun. 25, 2020

(87) PCT Pub. No.: WO2019/190557
PCT Pub. Date: Oct. 3, 2019

(65) Prior Publication Data
US 2020/0358463 A1    Nov. 12, 2020

(51) Int. Cl.
*H03F 1/02*       (2006.01)
*H04B 1/00*       (2006.01)
(Continued)

(52) U.S. Cl.
CPC ......... *H04B 1/0028* (2013.01); *H03G 3/3068* (2013.01); *H04B 1/30* (2013.01);
(Continued)

(58) Field of Classification Search
CPC ......... H03F 2200/294; H03F 2200/451; H03F 3/193; H03F 2200/222; H03F 3/195;
(Continued)

(56) References Cited

U.S. PATENT DOCUMENTS 7,733,981 B2 *    6/2010   Shi ........................... H03J 7/04
                                                              375/316
9,473,096 B2 *   10/2016   Petrovic .................. H03G 3/20
(Continued)

FOREIGN PATENT DOCUMENTS

EP          2750297 A1      7/2014
WO     WO-2019190557 A1    10/2019

OTHER PUBLICATIONS

"International Application Serial No. PCT/US2018/025442, International Search Report dated Jan. 3, 2019", 3 pgs.
(Continued)

*Primary Examiner* — Eva Y Puente
(74) *Attorney, Agent, or Firm* — Schwegman Lundberg & Woessner, P.A.

(57) ABSTRACT

An apparatus of user equipment (UE) includes a radio integrated circuit (IC), an adjustable external low noise amplifier (eLNA) external to the radio IC, and processing circuitry. The radio IC includes a receive signal circuit path including an adjustable gain internal low noise amplifier (iLNA), and a transmit signal circuit path including a digital-to-analog converter (DAC) circuit configured to convert digital signals to analog baseband signals for transmitting. The processing circuitry is configured to provide digital values of the digital signals to the DAC circuit and initiate adjusting gain of one or both of the iLNA and the eLNA according to the digital values.

14 Claims, 6 Drawing Sheets

(51) Int. Cl.
*H03G 3/30* (2006.01)
*H04B 1/30* (2006.01)
*H04L 25/03* (2006.01)
*H04L 25/06* (2006.01)

(52) U.S. Cl.
CPC .............. *H04L 25/03* (2013.01); *H04L 25/06* (2013.01); *H03F 1/0233* (2013.01)

(58) Field of Classification Search
CPC . H03F 3/72; H03F 3/19; H03F 1/0277; H03F 1/223; H03F 1/26; H03F 1/565; H03F 2200/111; H03F 3/211; H03F 3/245; H03F 2200/387; H03F 1/56; H03F 2200/18; H03F 2200/391; H01L 2924/00; H01L 2224/48247; H01L 2224/05624; H01L 2224/16225; H01L 2224/32225; H01L 2224/48465; H01L 2224/73204; H01L 2924/1305; H01L 2924/1306; H01L 2924/13091; H01L 2924/14; H01L 2924/15787; H01L 2924/181; H01L 2924/30107; H04W 52/52; H04W 84/12; H04W 4/80; H04W 72/0453; H04W 88/06; H04W 24/02; H04W 24/06; H04W 24/08; H04W 28/10; H04W 40/08; H04W 52/0251; H04W 72/0406; H04W 72/0426
USPC ......................................................... 375/316
See application file for complete search history.

(56) References Cited

U.S. PATENT DOCUMENTS

| | | | | |
|---|---|---|---|---|
| 10,200,002 | B1* | 2/2019 | Youssef | H04B 1/109 |
| 10,432,247 | B2* | 10/2019 | Pawliuk | H04W 56/002 |
| 2005/0190483 | A1* | 9/2005 | Iketo | G06F 3/0676 |
| | | | | 360/69 |
| 2009/0221259 | A1* | 9/2009 | Shiramizu | H03D 7/1441 |
| | | | | 455/334 |
| 2009/0310524 | A1* | 12/2009 | Katsube | H04L 7/041 |
| | | | | 370/311 |
| 2010/0271987 | A1 | 10/2010 | Chiu et al. | |
| 2012/0329417 | A1 | 12/2012 | Chang et al. | |
| 2013/0260699 | A1* | 10/2013 | Fernando | H04B 17/24 |
| | | | | 455/79 |
| 2014/0162732 | A1* | 6/2014 | Yin | H03G 3/3036 |
| | | | | 455/571 |
| 2014/0213200 | A1 | 7/2014 | Brinkhoff et al. | |
| 2014/0341097 | A1 | 11/2014 | Gomez et al. | |
| 2015/0003436 | A1 | 1/2015 | Shapira | |
| 2015/0015432 | A1* | 1/2015 | Chang | G01S 13/38 |
| | | | | 342/22 |
| 2015/0180516 | A1 | 6/2015 | Salvi et al. | |
| 2016/0020737 | A1* | 1/2016 | Kong | H01Q 21/28 |
| | | | | 455/73 |

OTHER PUBLICATIONS

"International Application Serial No. PCT/US2018/025442, Written Opinion dated Jan. 3, 2019", 10 pgs.

* cited by examiner

DETECTING HIGH TX LEAKAGE TO IMPROVE LINEARITY

PRIORITY APPLICATION

This application is a U.S. National Stage Application under 35 U.S.C. 371 from International Application No. PCT/US2018/025442, filed Mar. 30, 2018, published as WO 2019/190557, which is incorporated herein by reference in its entirety.

TECHNICAL FIELD

Various embodiments may relate generally to the field of wireless communications. Some embodiments relate to radio access networks (e.g. Third Generation Partnership Project Long Term Evolution (3GPP LTE) networks, as well as fifth generation (5G) new radio (NR) networks), and in particular to devices to detect high transmission leakage and improve signal linearity and noise figure for duplex communication.

BACKGROUND

Radio access networks can be used for delivering voice communications to user equipment (UE) such as a mobile cellular telephone or a smart phone or a smart device or tablet. A desirable feature of mobile communication devices is full duplex communication, or the simultaneous transmission or reception of at least two distinct frequency channels. A challenge to implementing full duplex communication is the problem of crosstalk between the frequency channels during the simultaneous operation of the channels. Thus, there are general needs for devices, systems and methods that provide robust communication channels with minimum crosstalk in end-to-end voice communications.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Radio frequency devices that communicate using a radio access network include user equipment (UE) such as cell phones, laptop computers, and tablet computers. The UE communicates with a cell that connects the user equipment to the backhaul of the cell network.

Figure 1:
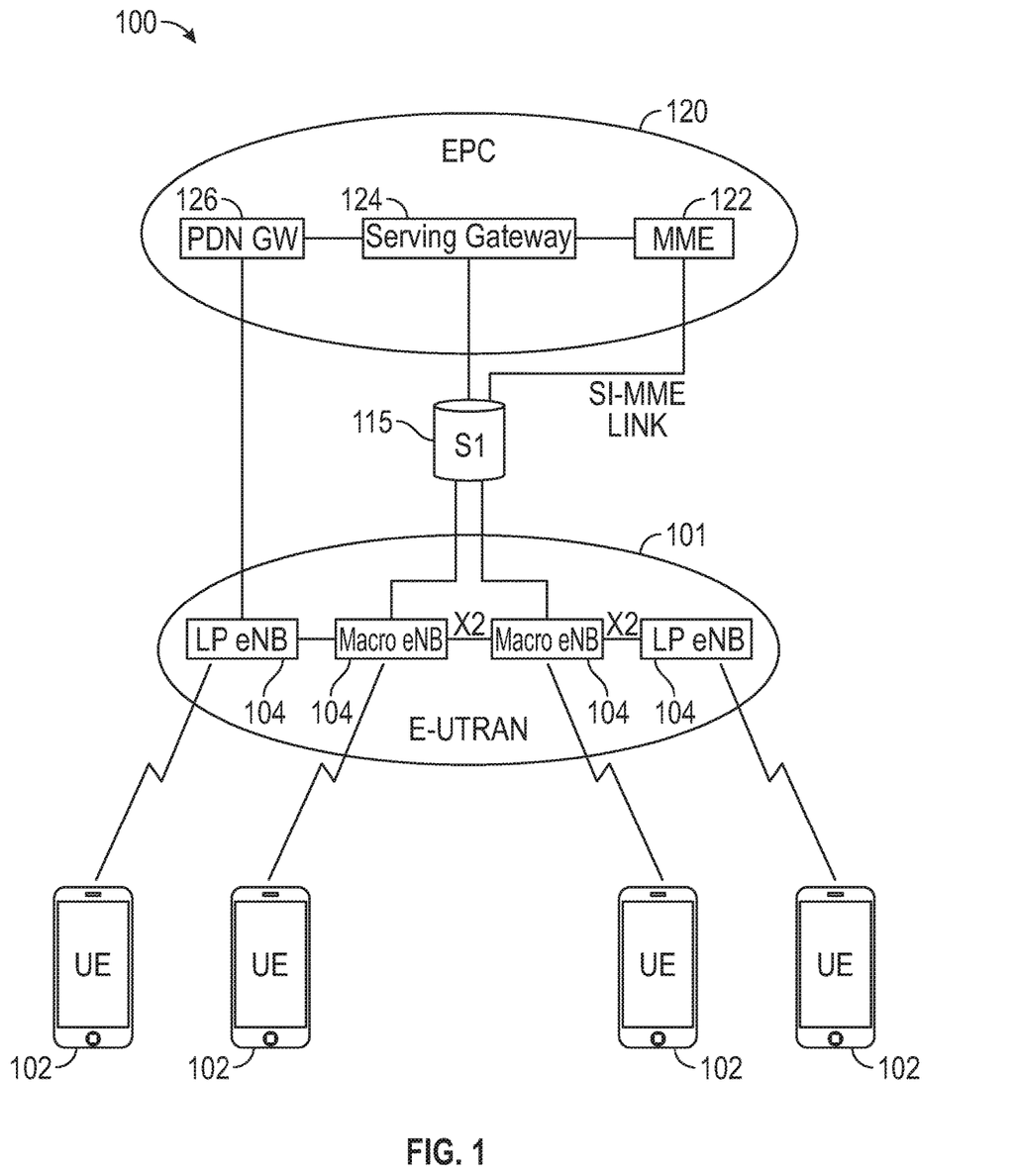
FIG. 1 is a diagram of a portion of an end-to-end network architecture of a wireless network with various components of a radio access network (RAN) in accordance with some exemplary aspects of this disclosure.

FIG. 1 is a diagram of a portion of an end-to-end network architecture of a wireless network with various components of the network in an aspect. The network 100 comprises a radio access network (RAN) (shown as an E-UTRAN or evolved universal terrestrial radio access network) and the core network 120 (e.g., shown as an evolved packet core (EPC)) coupled together through an S1 interface 115. For convenience and brevity sake, only a portion of the core network 120 is shown as well as the RAN 101.

The core network 120 includes mobility management entity (MME) 122, serving gateway (serving GW) 124, and packet data network gateway (PDN GW) 126. The RAN 101 includes enhanced node Bs (eNBs) 104 (which may operate as base stations (BSs)) for communicating with user equipment (UE) 102. The eNBs 104 may include macro eNBs and low power (LP) eNBs.

The MME 122 is similar in function to the control plane of legacy Serving GPRS Support Nodes (SGSN). The MME manages mobility aspects in access such as gateway selection and tracking area list management. The serving GW 124 terminates the interface toward the RAN 101, and routes data packets between the RAN 101 and the core network 120. In addition, it may be a local mobility anchor point for inter-eNB handovers and also may provide an anchor for inter-3GPP mobility. Other responsibilities may include lawful intercept, charging, and some policy enforcement. The serving GW 124 and the MME 122 may be implemented in one physical node or separate physical nodes. The PDN GW 126 terminates an SGi interface toward the packet data network (PDN). The PDN GW 126 routes data packets between the EPC 120 and the external PDN, and may be a key node for policy enforcement and charging data collection. It may also provide an anchor point for mobility with non-LTE accesses. The external PDN can be any kind of IP network, as well as an IP Multimedia Subsystem (IMS) domain. The PDN GW 126 and the serving GW 124 may be implemented in one physical node or separated physical nodes.

The eNBs 104 (macro and micro) terminate the air interface protocol and may be the first point of contact for a UE 102. In some embodiments, an eNB 104 may fulfill various logical functions for the RAN 101 including but not limited to RNC (radio network controller functions) such as radio bearer management, uplink and downlink dynamic radio resource management and data packet scheduling, and mobility management. In accordance with embodiments, UEs 102 may be configured to communicate OFDM communication signals with an eNB 104 over a multicarrier communication channel in accordance with an OFDMA communication technique. The OFDM signals may comprise a plurality of orthogonal subcarriers.

Figure 2:
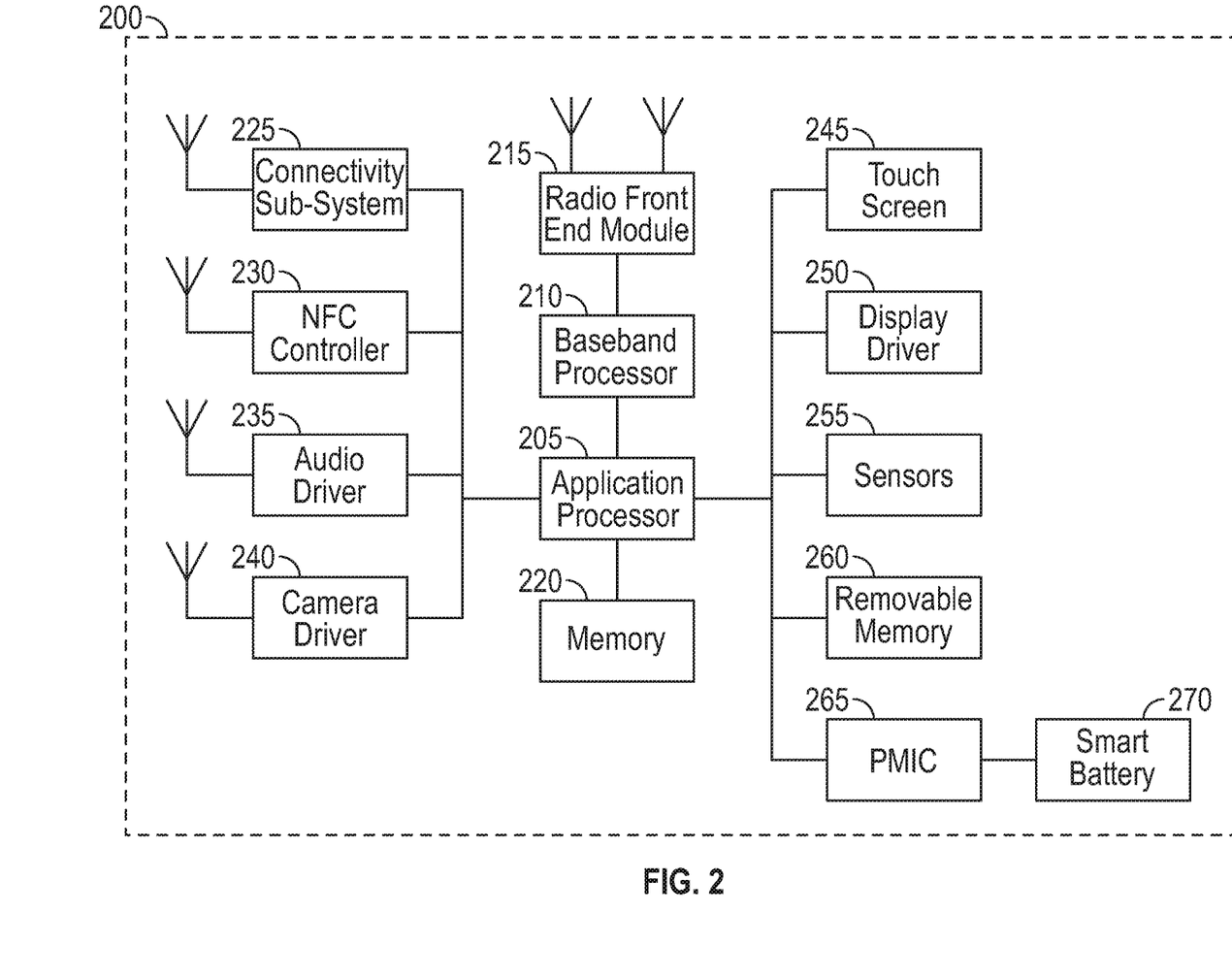
FIG. 2 illustrates UE of a RAN in accordance with some aspects.

FIG. 2 illustrates user equipment (UE) in an aspect. The UE 200 may be a mobile device, in some aspects, and includes processing circuitry, such as an application processor 205 and a baseband processor 210 (also referred to as a baseband sub-system). The UE 200 also includes a radio front end module (RFEM) 215, memory 220, connectivity sub-system 225, near field communication (NFC) controller 230, audio driver 235, camera driver 240, touch screen 245, display driver 250, sensors 255, removable memory 260, power management integrated circuit (PMIC) 265 and smart battery 270. The RFEM 215 can include radio frequency transceiver circuitry connected to multiple antennas. In some aspects, the transceiver circuitry can include one or more radio integrated circuits.

Figure 3:
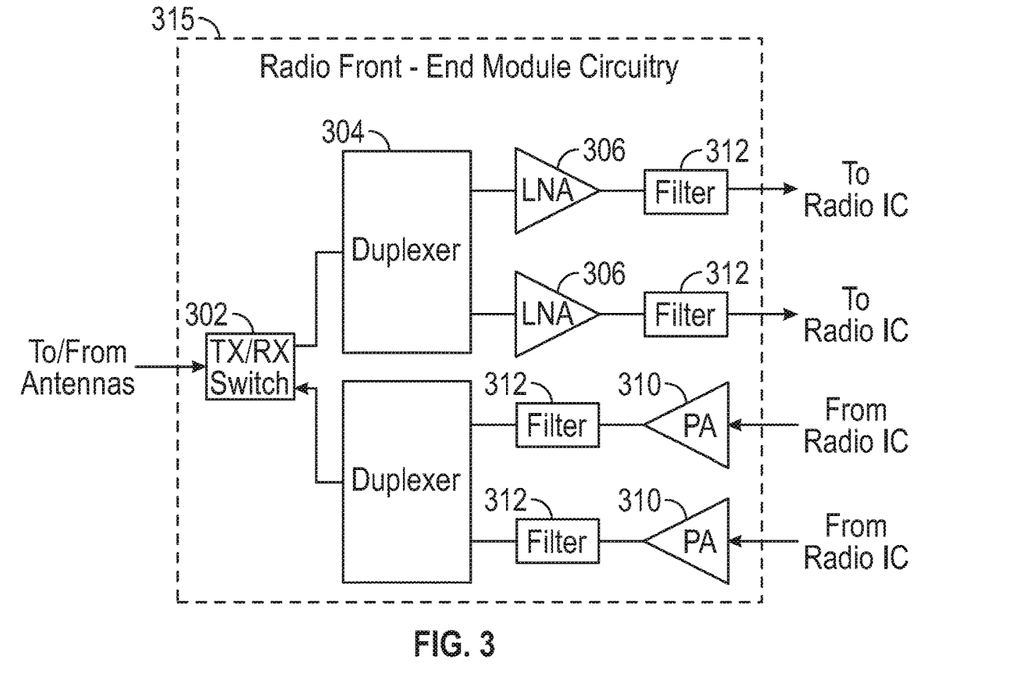
FIG. 3 illustrates portions of radio front end module (RFEM) circuitry in accordance with some aspects.

FIG. 3 illustrates portions of RFEM circuitry 315 in an aspect. The RFEM circuitry 315 may include a receive signal path and a transmit signal path connected to a transmit/receive switch 302. The ability to transmit and receive radio frequency signals at the same time can be referred to as full duplex communication. The example of FIG. 3 shows multiple receive signal paths and multiple transmit signal paths. The receive signal path may include a receive signal path duplexer 304 to separate the signals from each spectrum. The receive signal path can include a low-noise amplifier (LNA) 306 to amplify received radio frequency (RF) signals. The receive signal path may include an LNA 306 for each spectrum from the duplexer. The receive signal path may also include one or more filter circuits 312, such as band-pass filters (BPFs), low-pass filters (LPFs) or other types of filters to filter RF signals received by one or more of the antennas of the UE. The transmit signal path may include a power amplifier (PA) 310 to amplify input RF signals, and one or more filter circuits 312 to generate RF signals for subsequent transmission by one or more of the antennas of the UE.

Figure 4:
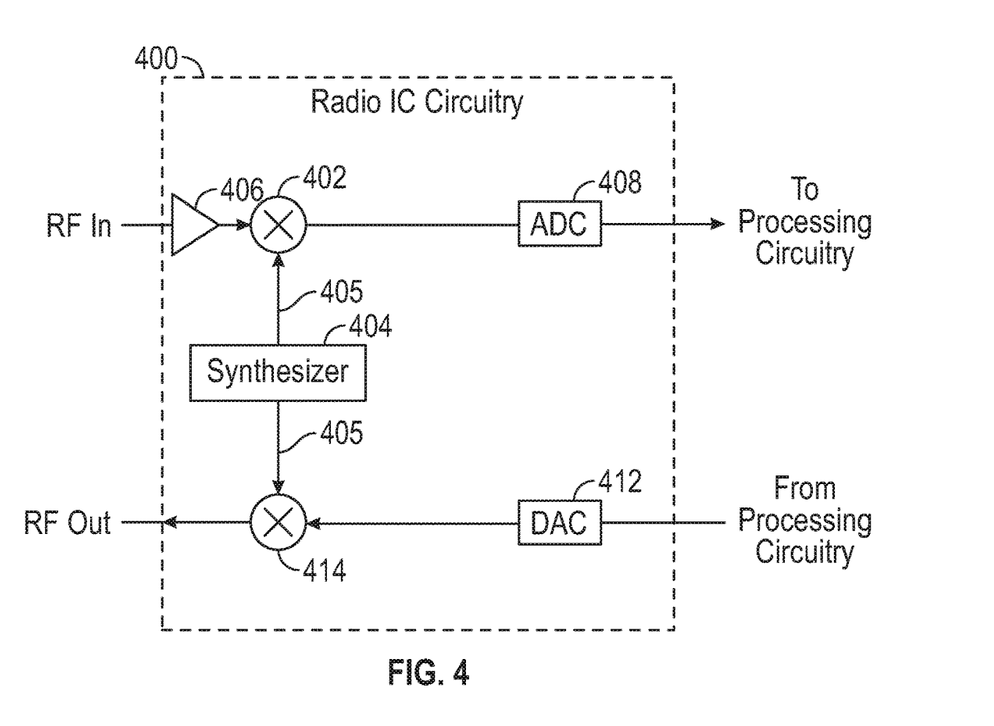
FIG. 4 illustrates portions of circuitry of a radio integrated circuit in accordance with some aspects.

FIG. 4 illustrates portions of circuitry of a radio integrated circuit (IC) that may be included in the RFEM 215 of the UE of FIG. 2. The radio IC 400 includes a receive signal circuit path and a transmit signal circuit path. The receive signal circuit path of the radio IC 400 may include mixer circuitry 402 (e.g., down-conversion mixer circuitry) and an LNA 406. Because LNA 406 is internal to the radio IC, it can be referred to as an internal LNA (iLNA), and the LNA 306 of the RFEM circuitry 315 can be referred to as an external LNA (eLNA). One or both of the iLNA and the eLNA may have adjustable gain to amplify RF signals. The receive signal circuit path may also include an analog-to-digital converter (ADC) circuit 408 to convert received analog baseband signals to digital baseband signals for further processing by the baseband processor 210 of the UE.

The transmit signal circuit path of the radio IC circuitry may include a digital-to-analog converter (DAC) circuit 412 to convert digital baseband signal provided by the baseband processor to analog baseband signals. The transmit signal path also includes mixer circuitry 414 (e.g., up-conversion mixer circuitry). The radio IC may also include synthesizer circuitry 404 for synthesizing a local oscillator (LO) frequency 405 for use by the mixer circuitry 402 and the mixer circuitry 414.

Figure 5A:
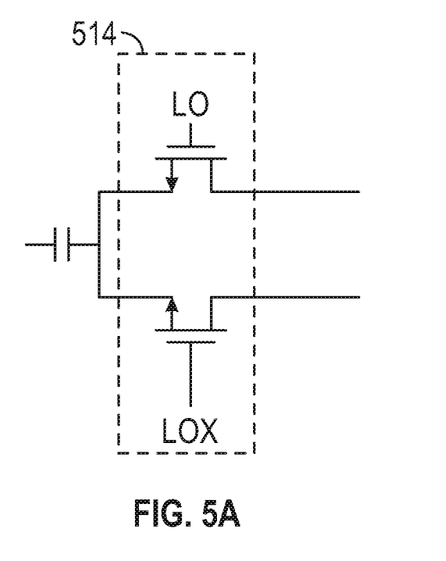
FIG. 5A illustrates a portion of a mixer circuit for reverse polarity digital-to analog converter injection in an aspect.
Figure 5B:
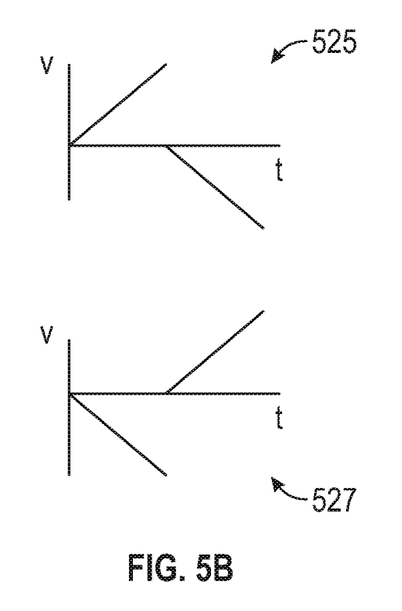
FIG. 5B illustrates a ramping waveform and an inverted ramping waveform as outputs of a reverse polarity digital-to-analog converter in an aspect.

In some aspects, the DAC circuit 412 may provide reverse polarity injection of the digital signals to the up-conversion mixer circuitry. FIGS. 5A and 5B illustrate reverse polarity DAC injection in an aspect. FIG. 5A shows portions of one mixer circuit 514 (such as mixer circuitry 414 in FIG. 4), and FIG. 5B shows a ramping waveform 525 and an inverted ramping waveform 527. The ramping waveforms represent the output of the DAC for increasing input digital values. The discontinuities in the ramping occur where the DAC circuit rolls over from a positive to negative value or negative to positive value. For example, if the DAC circuit 412 is a 7-bit DAC circuit, the DAC circuit may represent numbers 0-63 as a positive output and numbers 64-127 as a negative output as shown in waveform 525. The discontinuity may occur when the DAC input changes from 63 to 64. FIG. 5B shows that DAC values of opposite polarity are injected into the mixer circuitry. The reverse polarity DAC injection to the mixer circuitry improves dynamic range compared to monotonic injection and may reduce DC offset in the generated analog baseband signals resulting from DC offset in the DAC circuit.

Returning to FIG. 4, the radio IC example shows just one receive signal circuit path and one transmit signal circuit path for simplicity. The radio IC 400 may include multiple receive signal circuit paths and multiple transmit signal circuit paths. The radio IC may include a receive signal circuit path for each separate signal produced by duplexer 304 of the RFEM circuitry 315.

As explained above, the baseband processor 210 in FIG. 2 may receive digital signals from the ADC circuit 408 and provide digital signals to the DAC circuit 412 of the radio IC. In some aspects, baseband processor 210 may be implemented, for example, as a solder-down substrate including one or more integrated circuits, a single packaged integrated circuit soldered to a main circuit board, and/or a multi-chip module containing two or more integrated circuits.

Figure 6:
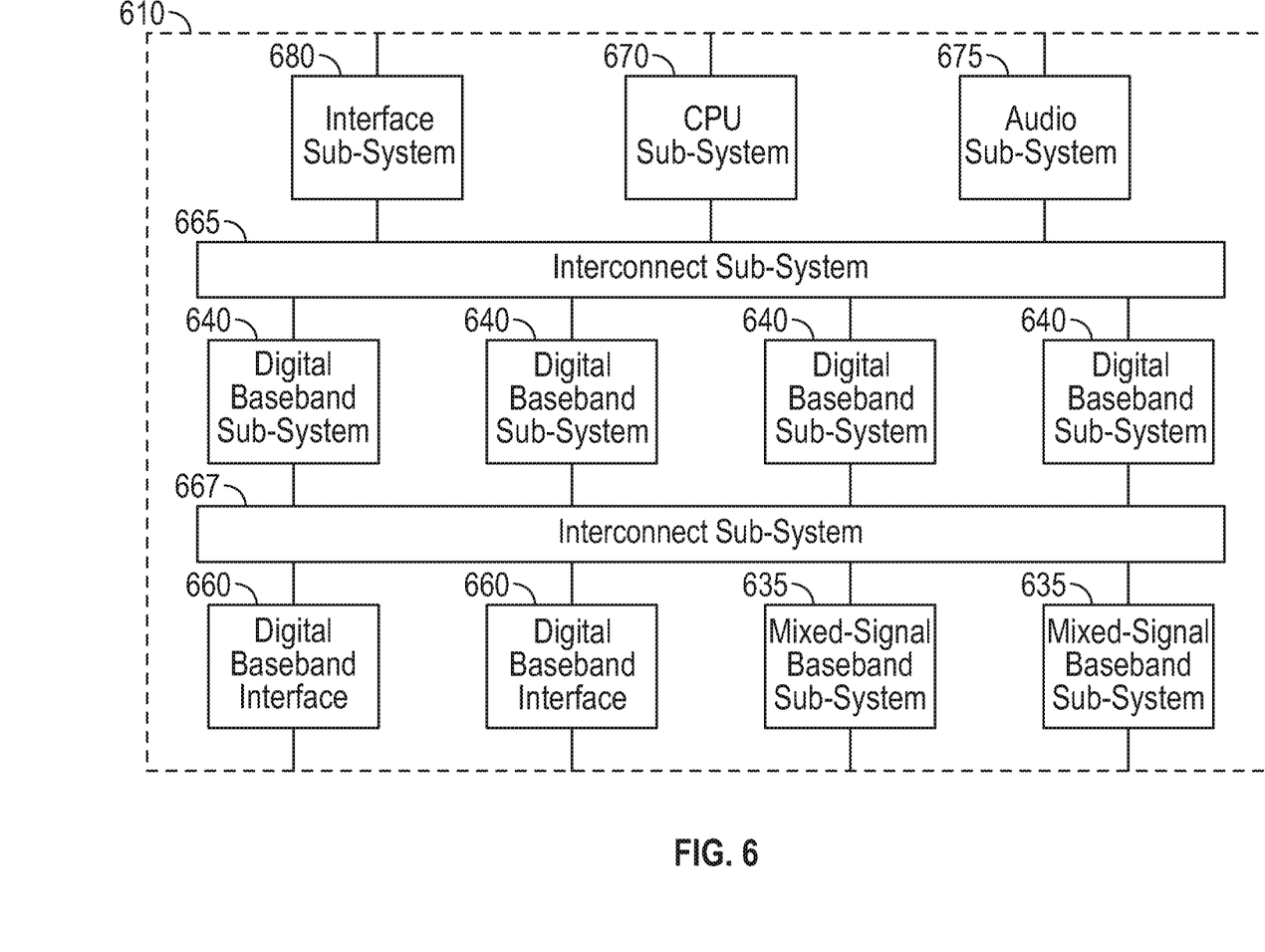
FIG. 6 illustrates a multi-protocol baseband processor in accordance with some aspects.

FIG. 6 illustrates a multi-protocol baseband processor 610 in an aspect, such as the baseband processor 210 of the UE in the example of FIG. 2. In an aspect, baseband processor may contain one or more digital baseband subsystems 640. In an aspect, the one or more digital baseband subsystems 640 may be coupled via interconnect subsystem 665 to one or more of central processing unit (CPU) subsystem 670, audio sub-system 675 and interface subsystem 680.

In an aspect, the one or more digital baseband subsystems 640 may be coupled via interconnect subsystem 667 to one or more of each of digital baseband interface 660 and mixed-signal baseband sub-system 635. In an aspect, interconnect subsystem 665 and 667 may each include one or more each of buses point-to-point connections and network-on-chip (NOC) structures. In an aspect, audio sub-system 675 may include one or more of digital signal processing circuitry, buffer memory, program memory, speech processing accelerator circuitry, data converter circuitry such as analog-to-digital and digital-to-analog converter circuitry, and analog circuitry including one or more of amplifiers and filters.

Full duplex communication can cause problems with noise between the transmitting channel and simultaneously receiving channel. The noise figure (NF) of the duplex communication can be improved be detecting high power transmission modes of the transmit signal paths and altering the receive signal paths accordingly. In some aspects, the baseband processor 210 of the UE of FIG. 2 alters the receive signal circuit path according to digital values it provides to the DAC circuit. For example, the baseband processor 210 may compare the digital values to a specified threshold digital value, and may initiate a decrease in the gain of one or both of the iLNA and eLNA when a digital value exceeds the specified threshold digital value. Conversely, the baseband processor may initiate an increase in the gain of one or both of the iLNA and eLNA when a digital value is less than the specified threshold digital value.

The eLNA of FIG. 3 and the iLNA 406 of FIG. 4 can be configured to provide programmable gain. The amplifier circuits may include logic circuits that adjust one or both of the input path and feedback path of the amplifier circuits to change the signal gain.

In some aspects, the baseband processor does not initiate adjustment of the gain of one or both amplifiers until a specified number of digital values satisfies the specified threshold digital value. In some aspects, hysteresis is used in changing the gain of the amplifiers. For example, the baseband processor may initiate an increase in the gain of one or both amplifiers when a digital value is greater than a first specified threshold, and may initiate a decrease in the gain of one or both amplifiers when a digital value is less than a second specified threshold that is less than the first specified threshold. Hysteresis in the gain adjustment may improve performance when digital values change back and forth near a specified threshold.

In some aspects, different thresholds can be used to control different amplifiers. For example, the baseband processor may initiate a decrease in gain of the iLNA when the digital values provided to the DAC circuit exceed a first specified threshold, and the baseband processor may initiate a change in the eLNA when the digital values provided to the DAC circuit exceed a second specified threshold different from the first specified threshold. Multiple threshold values can be used to adjust the gain of the low noise amplifiers. For example, separate thresholds can be specified for each of the iLNA and eLNA to provide separate hysteresis to the gain adjustment for the amplifiers.

The gain adjustment has been described for the receive signal circuit path example of the FIG. 4. The RFEM circuitry of the UE may include multiple receive signal circuit paths that each may include an iLNA and an eLNA. In some aspects, a memory (e.g., memory 220 in FIG. 3) may store multiple specified threshold values for the multiple amplifiers as a lookup table. The lookup table may be indexed according to the amplifier being controlled.

The baseband processor may alter the receive signal circuit path in other ways. In some aspects, the filter circuit 312 of a receive circuit signal path in FIG. 3 is switchable into and out of the receive signal circuit path. A filter circuit may cause some signal loss. If the received RF signal is a low-level RF signal, the baseband processor may switch the filter circuit out of the receive signal circuit path to avoid losing some of the low level signal. This results in a filter-less receive signal circuit path.

Figure 7:
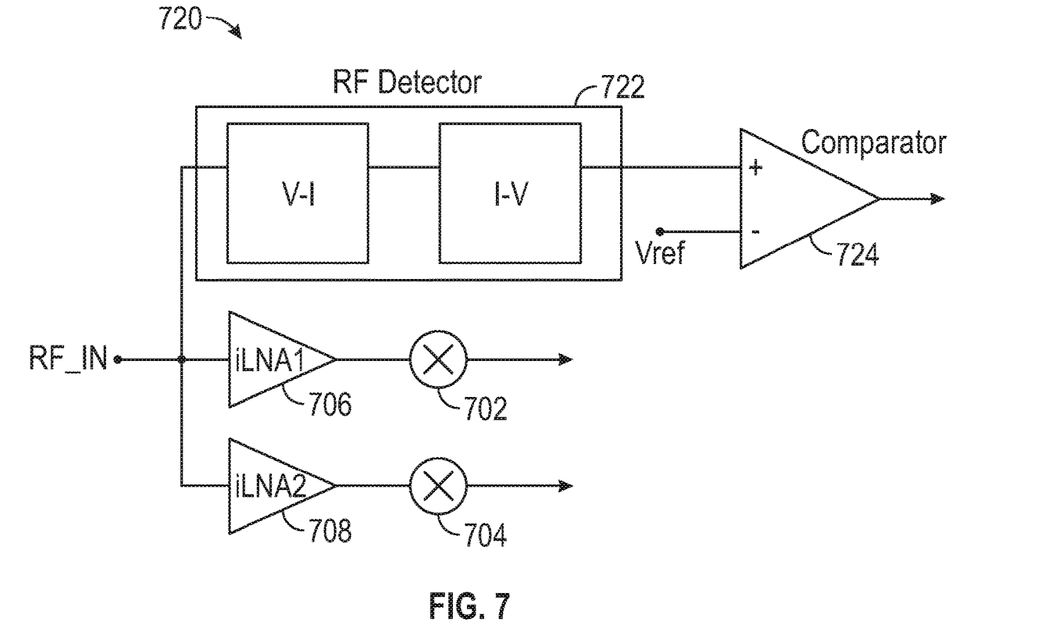
FIG. 7 is a circuit diagram of portions of two receive signal circuit paths of a radio IC in accordance with some aspects.

FIG. 7 is a circuit diagram of portions of two receive signal circuit paths of a radio IC in an aspect. In some aspects, the receive signal circuit paths can each include an internal low noise amplifier (iLNA1 706 and iLNA2 708) followed by mixer circuitry 702, 704. Electrically coupled to the receive signal circuit paths is an RF detector 720 that may be included in the radio IC. The RF detector 720 includes an RF signal detection circuit 722 and a comparator circuit 724. The RF signal detection circuit 722 generates a detection voltage from an analog baseband signal received via a receive signal circuit path and provides the detection voltage to the comparator circuit 724. The comparator circuit 724 compares the detection voltage to a threshold voltage and generates a comparator output that indicates the result of the comparison. In some aspects, the RF detector includes a programmable voltage reference circuit and the threshold voltage is programmable.

The baseband processor 210 detects the comparator output and switches the filter circuit into or out of the receive signal circuit path according to the comparator output. For example, the baseband processor may switch the filter circuit out of the receive signal circuit when the detection voltage is below a specified threshold. In some aspects, the baseband processor may switch the filter circuit out of the receive signal circuit path and increase the gain of one or both of the iLNA and eLNA when the detection voltage is below the specified threshold. Conversely, the baseband processor may switch the filter circuit into the receive signal circuit path when the detection voltage is above a different detection threshold and decrease the gain of one or both of the iLNA and eLNA when the detection voltage is above the detection threshold. Multiple comparator circuits can be used to provide individual enabling of the switching of the filter circuit and adjusting of the gain of an amplifier.

Figure 8:
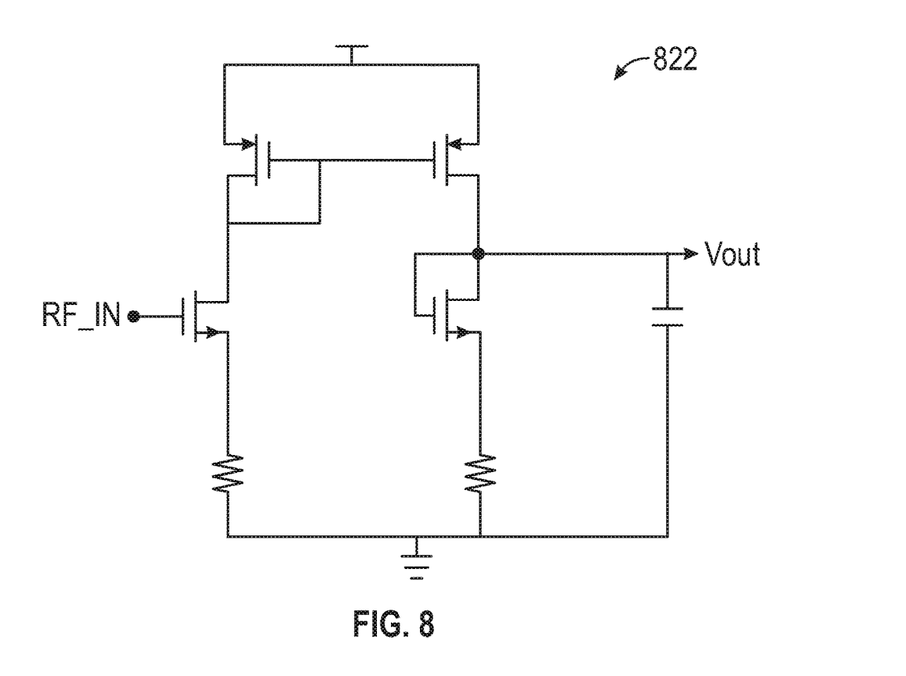
FIG. 8 is a circuit diagram of a radio frequency (RF) signal detection circuit in accordance with some aspects.

In the example of FIG. 7, the RF signal detection circuit 722 generates the detection voltage by converting a voltage of the receive signal circuit path to a current, and the current is converted to the detection voltage. FIG. 8 is a circuit diagram of an RF signal detection circuit 822 in an aspect. In some aspects, the RF signal detection circuit with input RF_IN and that includes a transconductance amplifier that converts the voltage of the receive signal circuit path to the current. The current is converted to an output voltage Vout that is the detection voltage provided to the comparator circuit.

The devices and methods described improve the noise factor of duplex communication in the presence of high transmission leakage and allow for filter-less operation in the presence of low level input signals.

ADDITIONAL DESCRIPTION AND EXAMPLES

Example 1 includes subject matter (such as an apparatus of UE) comprising a radio integrated circuit (IC), an adjustable gain external low noise amplifier (eLNA) external to the radio IC, and processing circuitry. The radio IC includes a receive signal circuit path including an adjustable gain internal low noise amplifier (iLNA); and a transmit signal circuit path including a digital-to-analog converter (DAC) circuit configured to convert digital signals to analog baseband signals for transmitting. The processing circuitry is configured to provide digital values of the digital signals to the DAC circuit and initiate adjusting gain of one or both of the iLNA and the eLNA according to the digital values.

In Example 2, the subject matter of Example 1 optionally includes processing circuitry configured to initiate a decrease in the gain of one or both of the iLNA and the eLNA when a digital value of a digital signal for conversion to an analog baseband signal exceeds a specified threshold digital value.

In Example 3, the subject matter of one or both of Examples 1 and 2 optionally includes processing circuitry configured to compare the digital values to multiple threshold digital values and adjust the gain of one or both of the iLNA and eLNA according to the comparison.

In Example 4, the subject matter of one or any combination of Examples 1-3 optionally includes a memory configured to store the specified threshold values in a lookup table.

In Example 5, the subject matter of one or any combination of Examples 1-4 optionally includes a transmit signal circuit path that includes up-conversion mixer circuitry and the DAC circuit provides reverse polarity injection of the digital signals to the up-conversion mixer circuitry to reduce DC offset in the analog baseband signals.

In Example 6, the subject matter of one or any combination of Examples 1-6 optionally includes a radio IC that includes a second receive signal circuit path with a second adjustable gain iLNA, and wherein the processing circuitry is configured initiate adjusting gain of one or any combination of the iLNA and the eLNA according to the digital values.

In Example 7, the subject matter of one or any combination of Examples 1-6 optionally includes a radio frequency signal detection circuit configured to generate a detection voltage from an analog baseband signal received via the receive signal circuit path; a comparator circuit configured to compare the detection voltage to a threshold voltage and generate a comparator output according to the comparison; and a filter circuit switchable into and out of the receive signal circuit path. The processing circuitry is optionally configured to one or both of adjust the gain of one or both of the iLNA and eLNA and switch the filter circuit into or out of the receive signal circuit path according to the comparator output.

In Example 8, the subject matter of Example 7 optionally includes processing circuitry configured to initiate switching the filter circuit out of the receive signal circuit path when the detection voltage is less than a first specified threshold voltage.

In Example 9, the subject matter of Example 8 optionally includes processing circuitry configured to initiate a decrease in the gain of one or both of the iLNA and eLNA when the detection voltage exceeds a second specified threshold voltage.

Example 10 includes subject matter (such as an apparatus of UE), or can optionally be combined with one or more of Examples 1-9 to include such subject matter, comprising a radio IC, a filter circuit, an external low noise amplifier (eLNA) external to the radio IC, and processing circuitry. The radio IC includes a receive signal circuit path including an internal low noise amplifier (iLNA) configured to receive an analog baseband signal; a radio frequency (RF) signal detection circuit configured to generate a detection voltage from the analog baseband signal; and a comparator circuit configured to compare the detection voltage to a specified threshold voltage and generate a comparator output according to the comparison. The filter circuit is switchable into and out of the receive signal circuit path, and the eLNA has adjustable gain. The processing circuitry is configured to initiate, according to the comparator output, one or both of adjusting gain of the eLNA and switching the filter circuit into or out of the receive signal circuit path.

In Example 11, the subject matter of Example 10 optionally includes processing circuitry configured to initiate switching the filter circuit out of the receive path when the detection voltage is less than a first specified threshold voltage.

In Example 12, the subject matter of Example 11 optionally includes processing circuitry configured to initiate a decrease in the gain of the eLNA when the detection voltage exceeds a second specified threshold voltage.

In Example 13, the subject matter of one or any combination of Examples 10-12 optionally includes an RF signal detection circuit configured to convert a voltage of the received analog baseband signal to a first voltage, convert the first voltage to a current, and convert the current to the detection voltage.

In Example 14, the subject matter of Example 13 optionally includes an RF signal detection circuit includes a transconductance amplifier configured to convert the first voltage to a current.

In Example 15, the subject matter of one or any combination of Examples 10-14 optionally includes a programmable voltage reference circuit to generate the threshold voltage.

Example 16 includes subject matter (such as a computer-readable storage medium that stores instructions for execution by one or more processors of user equipment (UE) to perform operations to configure the UE), or can optionally be combined with one or more of Examples 1-15 to include such subject matter, comprising: providing digital signals to a digital-to-analog converter (DAC) circuit for conversion to analog baseband signals for transmitting by the UE; and initiating adjusting gain of one or more low noise amplifiers included in a receive signal circuit path of the UE according to digital values of the digital signals provided to the DAC circuit.

In Example 17, the subject matter of Example 16 optionally includes instructions that cause the one or more processors of the UE to perform operations to configure the UE to initiate a decrease in the gain of one or both of the low noise amplifiers when a digital value for conversion to an analog baseband signal exceeds a specified threshold digital value.

In Example 18, the subject matter of one or both of Examples 16 and 17 optionally include instructions that cause the one or more processors of the UE to perform operations to configure the UE to: receive an analog baseband signal; receive an indication of a result of a comparison of a detected voltage of the received analog baseband signal to a specified threshold voltage; and initiate, according to the indication, one or both of switching the filter circuit into or out of the receive signal circuit path, and adjusting gain of the one or more low noise amplifiers.

In Example 19, the subject matter of Example 18 optionally includes instructions that cause the one or more processors of the UE to perform operations to configure the UE to initiate switching the filter circuit out of the receive signal circuit path when the detection voltage is less than a first specified threshold voltage.

In Example 20, the subject matter of Example 19 optionally includes instructions that cause the one or more processors of the UE to perform operations to configure the UE to initiate a decrease in the gain of one or both of the low noise amplifiers when the detection voltage exceeds a second specified threshold voltage.

These non-limiting examples can be combined in any permutation or combination. The above detailed description includes references to the accompanying drawings, which form a part of the detailed description. The drawings show, by way of illustration, specific embodiments that can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Method examples described herein can be machine or computer-implemented at least in part. Some examples can include a computer-readable storage medium or machine-readable storage medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. The code can be tangibly stored on one or more volatile, non-transitory, or non-volatile tangible computer-readable media, such as during execution or at other times. Examples of these tangible computer-readable storage media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment. Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

What is claimed is:

1. An apparatus of user equipment (UE), the apparatus comprising:
   a radio integrated circuit (IC) including:
   a receive signal circuit path including an internal low noise amplifier (iLNA) configured to receive an analog baseband signal;
   a radio frequency (RF) signal detection circuit configured to generate a detection voltage from the analog baseband signal; and
   a comparator circuit configured to compare the detection voltage to a specified threshold voltage and generate a comparator output according to the comparison;
   a filter circuit switchable into and out of the receive signal circuit path;
   an adjustable gain external low noise amplifier (eLNA) that is external to the radio IC; and
   processing circuitry configured to initiate, according to the comparator output, adjusting gain of the eLNA and switching the filter circuit into or out of the receive signal circuit path.

2. The apparatus of claim 1, wherein the processing circuitry is configured to compare the digital values to multiple threshold digital values and adjust the gain of one or both of the iLNA and eLNA according to the comparison.

3. The apparatus of claim 1, including a memory configured to store the specified threshold values in a lookup table.

4. The apparatus of claim 1, wherein the transmit signal circuit path includes up-conversion mixer circuitry, and the DAC circuit provides reverse polarity injection of the digital signals to the up-conversion mixer circuitry to reduce DC offset in the analog baseband signals.

5. The apparatus of claim 1, wherein the radio IC includes a second receive signal circuit path with a second adjustable gain iLNA, and wherein the processing circuitry is configured initiate adjusting gain of one or any combination of the iLNA and the eLNA according to the digital values.

6. The apparatus of claim 1, wherein the processing circuitry is configured to initiate switching the filter circuit out of the receive path when the detection voltage is less than a first specified threshold voltage.

7. The apparatus of claim 6, wherein the processing circuitry is configured to initiate a decrease in the gain of the eLNA when the detection voltage exceeds a second specified threshold voltage.

8. The apparatus of claim 1, wherein the RF signal detection circuit is configured to convert a voltage of the received analog baseband signal to a first voltage, convert the first voltage to a current, and convert the current to the detection voltage.

9. The apparatus of claim 8, wherein the RF signal detection circuit includes a transconductance amplifier configured to convert the first voltage to a current.

10. The apparatus of claim 1, including a programmable voltage reference circuit to generate the threshold voltage.

11. A non-transitory computer-readable storage medium storing instructions for execution by one or more processors of user equipment (UE) to perform operations to configure the UE to:
    provide digital signals to a digital-to-analog converter (DAC) circuit for conversion to analog baseband signals for transmitting by the UE;
    initiate adjusting gain of one or more low noise amplifiers included in a receive signal circuit path of the UE according to digital values of the digital signals provided to the DAC circuit for transmitting;
    receive an analog baseband signal;
    receive an indication of a result of a comparison of a detected voltage of the received analog baseband signal to a specified threshold voltage; and
    initiate, according to the indication, switching the filter circuit into or out of the receive signal circuit path, and adjusting gain of the one or more low noise amplifiers.

12. The non-transitory computer-readable storage medium of claim 11, including instructions that cause the one or more processors of the UE to perform operations to configure the UE to initiate a decrease in the gain of one or more of the low noise amplifiers when a digital value for conversion to an analog baseband signal exceeds a specified threshold digital value.

13. The non-transitory computer-readable storage medium of claim 11, including instructions that cause the one or more processors of the UE to perform operations to configure the UE to initiate switching the filter circuit out of the receive signal circuit path when the detection voltage is less than a first specified threshold voltage.

14. The non-transitory computer-readable storage medium of claim 13, including instructions that cause the one or more processors of the UE to perform operations to configure the UE to initiate a decrease in the gain of one or both of the low noise amplifiers when detection voltage exceeds a second specified threshold voltage.

* * * * *

UNITED STATES PATENT AND TRADEMARK OFFICE
CERTIFICATE OF CORRECTION

| | | |
|---|---|---|
| PATENT NO. | : 11,356,126 B2 | |
| APPLICATION NO. | : 16/958131 | |
| DATED | : June 7, 2022 | |
| INVENTOR(S) | : Alam et al. | |

It is certified that error appears in the above-identified patent and that said Letters Patent is hereby corrected as shown below:

In the Claims

In Column 10, Line 53, in Claim 14, after "when", insert --the--

Signed and Sealed this
Seventeenth Day of January, 2023

*Katherine Kelly Vidal*

Katherine Kelly Vidal
*Director of the United States Patent and Trademark Office*